(12) United States Patent
Ku et al.

(10) Patent No.: US 7,595,651 B2
(45) Date of Patent: Sep. 29, 2009

(54) CANTILEVER-TYPE PROBE CARD FOR HIGH FREQUENCY APPLICATION

(75) Inventors: Wei-Cheng Ku, Hsinchu Hsiang (TW); Chih-Hao Ho, Hsinchu Hsiang (TW); Shu-Kan Lin, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 0 days.

(21) Appl. No.: 11/705,523

(22) Filed: Feb. 13, 2007

(65) Prior Publication Data

US 2008/0191726 A1  Aug. 14, 2008

(51) Int. Cl.
  *G01R 31/02* (2006.01)
(52) U.S. Cl. ..................... 324/754; 324/757
(58) Field of Classification Search .......... 324/754–762
  See application file for complete search history.

(56) References Cited

U.S. PATENT DOCUMENTS

| | | | |
|---|---|---|---|
| 4,697,143 A * | 9/1987 | Lockwood et al. .......... 324/754 |
| 4,719,417 A * | 1/1988 | Evans .......................... 324/762 |
| 4,871,964 A * | 10/1989 | Boll et al. .................... 324/754 |
| 4,965,514 A * | 10/1990 | Herrick ....................... 324/754 |
| 6,247,939 B1 * | 6/2001 | Bestul et al. .................. 439/66 |
| 6,298,312 B1 * | 10/2001 | Chen .......................... 702/151 |
| 6,489,795 B1 * | 12/2002 | Klele et al. .................. 324/762 |
| 6,603,322 B1 * | 8/2003 | Boll et al. .................... 324/754 |
| 6,727,716 B1 * | 4/2004 | Sharif ......................... 324/754 |
| 7,084,650 B2 * | 8/2006 | Cooper et al. ............... 324/754 |
| 7,482,822 B2 * | 1/2009 | Cooper et al. ............... 324/754 |

\* cited by examiner

*Primary Examiner*—Ha Tran T Nguyen
*Assistant Examiner*—Joshua Benitez
(74) *Attorney, Agent, or Firm*—Bacon & Thomas, PLLC

(57) ABSTRACT

A cantilever-type probe card includes a circuit board, a grounding block electrically connected to a zero potential, signal probes, and at least one grounding probe connected to the grounding block. Each signal probe has a probing tip, a connection portion affixed to the circuit board, and a front arm defined between the connection portion and the probing tip. The front arm of each of the signal probes is suspended in the grounding block and spaced from the grounding block at a predetermined pitch.

11 Claims, 10 Drawing Sheets

CANTILEVER-TYPE PROBE CARD FOR HIGH FREQUENCY APPLICATION

BACKGROUND OF THE INVENTION

1. Field of the Invention

The present invention relates to probe cards and more particularly, to a cantilever-type probe card for high frequency application.

2. Description of the Related Art

FIG. 1 shows a cantilever-type probe card 1 according to the prior art. According to this design, the probe card 1 comprises a circuit board 10, a plurality of coaxial transmission lines 11, a probe holder 12, and a plurality of probes 13. The circuit board 10 has a plurality of contact pads 101 on the top side near the border for receiving test signals from a test machine. The coaxial transmission lines 11 are electrically connected between the contact pads 101 and the probes 13 for transmission of test signals from the test machine to the probes 13 which can electrically probe ICs of a semiconductor wafer.

The probe holder 12 has a grounding plane 121, a holder body 122, and a plurality of fastening members 123. The grounding plane 121 is electrically connected to the ground potential of the probe card 1. The probes 13 are mounted on the probe holder 12 and each comprises a tip 130, a body fastened to each of the fastening members 123, a front part 131 located between the tip and the fastening member 123, and a rear part 132 electrically connected to a contact pad 102 on the bottom side of the circuit board 10. The front part 131 of each of the probes 13 is suspended beneath the probe holder 12 to provide a lever arm for the tip 130 to buffer the anti-force reacted from the probed IC to the tip 130 during the wafer level test.

Further, each of the coaxial transmission lines 11 has an electrically grounded metal shield 111 provided axially around an axial wire to maintain the characteristic impedance of transmission for high-frequency signal through the coaxial transmission line 11. However, because the probes 13 are simply formed of a conducting metal without having a similar design functioned like the coaxial transmission lines 11, the parasitic capacitor that is induced subject to the dielectric surrounding around each of the probes 13 may cause the dielectric loss during a high frequency signaling through the probe 13, thus lowering the reliability of the wafer level test.

FIG. 2 shows an improved structure of cantilever-type probe card 2 according to the prior art. According to this design, a plurality of coaxial probes 20 are used to substitute the aforesaid single conducting metal of the probe 13, and the holder body 122 of the probe holder 12 is made of a conducting material. Each of the coaxial probes 20 comprises a metal pin 21, which has a front part 201 defined between a respective probing tip and the associating fastening member 123 and suspended beneath the probe holder 12 and a rear part 202 set between the associating fastening member 123 and the circuit board 10, a dielectric material 22 wrapping the rear part 202 of the metal pin 21, and an outer conducting layer 23 wrapping the dielectric material 22 and electrically connected with the holder body 122 to the ground potential of the probe card 2, so that the rear part 202 of the metal pin 21 of each coaxial probe 20 can maintain the characteristic impedance of transmission for a high frequency signal. However, because the front part 201 of each coaxial probe 20 is adapted to buffer the anti-force when the probing tip is probing the test sample, it is required for keeping its specific weight and being flexible, so the front part 201 of the coaxial probe 20 cannot be designed as a coaxial structure like the rear part 202 having wrapped by the dielectric material 22 and the outer conducting layer 23 that is electrically connected to the holder body 122 of the probe holder 12. Therefore, the characteristic impedance of a high frequency signaling through each coaxial probe 20 is maintained only at the rear part 202 of the metal pin 21, not reaching the front part 201. As a result, the dielectric loss also exists subject to the parasitic capacitor induced by the dielectric surrounding around the front part 201 of the metal pin 21 during transmission of a high frequency signal through the coaxial probe 20.

Therefore, it is desirable to provide a cantilever-type probe card that maintains the characteristic impedance during high frequency signaling and prevents stress damage to both the probes and the relative probed ICs during the wafer level test.

SUMMARY OF THE INVENTION

The present invention has been accomplished under the circumstances in view. It is therefore the main object of the present invention to provide a cantilever-type probe card, which achieves high quality transmission of high frequency test signal, and is effective for use in a wafer level test work.

To achieve this object of the present invention, the cantilever-type probe card comprises a circuit board, a grounding block, a plurality of signal probes, and at least one grounding probe. The circuit board has arranged thereon a plurality of signal lines respectively electrically connected to the signal probes and transmitted test signals from a test machine to the respective signal probes. The grounding block is a metal block electrically connected to the ground potential of the circuit board and the at least one grounding probe. The signal probes and the at least one grounding probe each has a connection portion, a probing tip, and a front arm defined between the connection portion and the probing tip. The connection portions of the signal probes and the at least one grounding probe are fastened to the circuit board. The front arms of the signal probes are suspended in the grounding block and spaced from the grounding block at a predetermined pitch.

When the signal probes and the at least one grounding probe probing on the ICs of the test wafer, there is a longitudinal buffer for each of the probing tips to maintain optimal contact with the ICs of the test wafer and to buffer the stress acted upon the probes as the probing tips are receiving the anti-force reacted by the probed ICs. Further, because the front arms of the probes are suspended in the grounding block and kept spaced from the grounding block at a predetermined pitch, the desired characteristic impedance matching is well maintained for high frequency signal transmission, ensuring high test reliability.

BRIEF DESCRIPTION OF THE DRAWINGS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
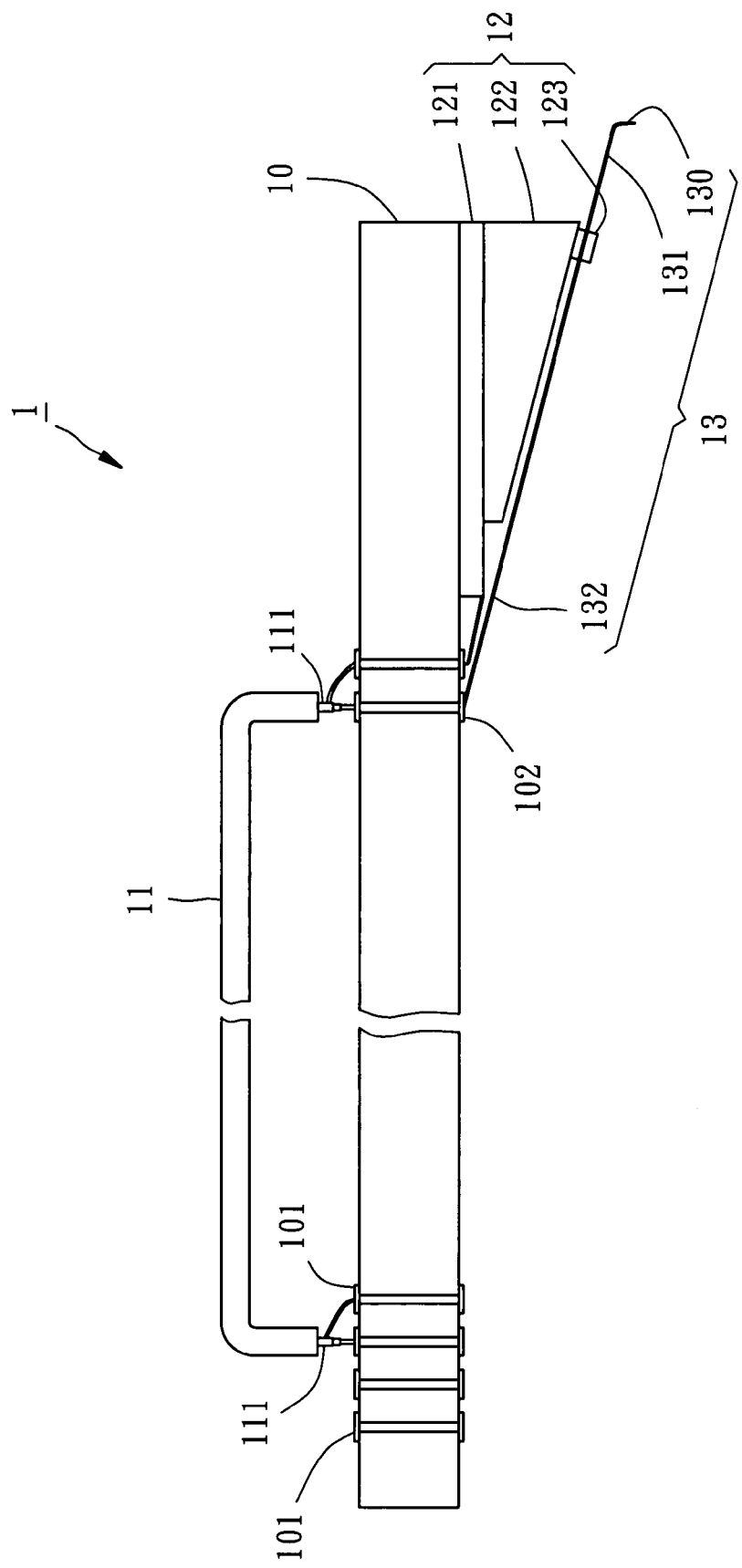
FIG. 1 is a schematic sectional view of a cantilever probe card according to the prior art.
Figure 2:
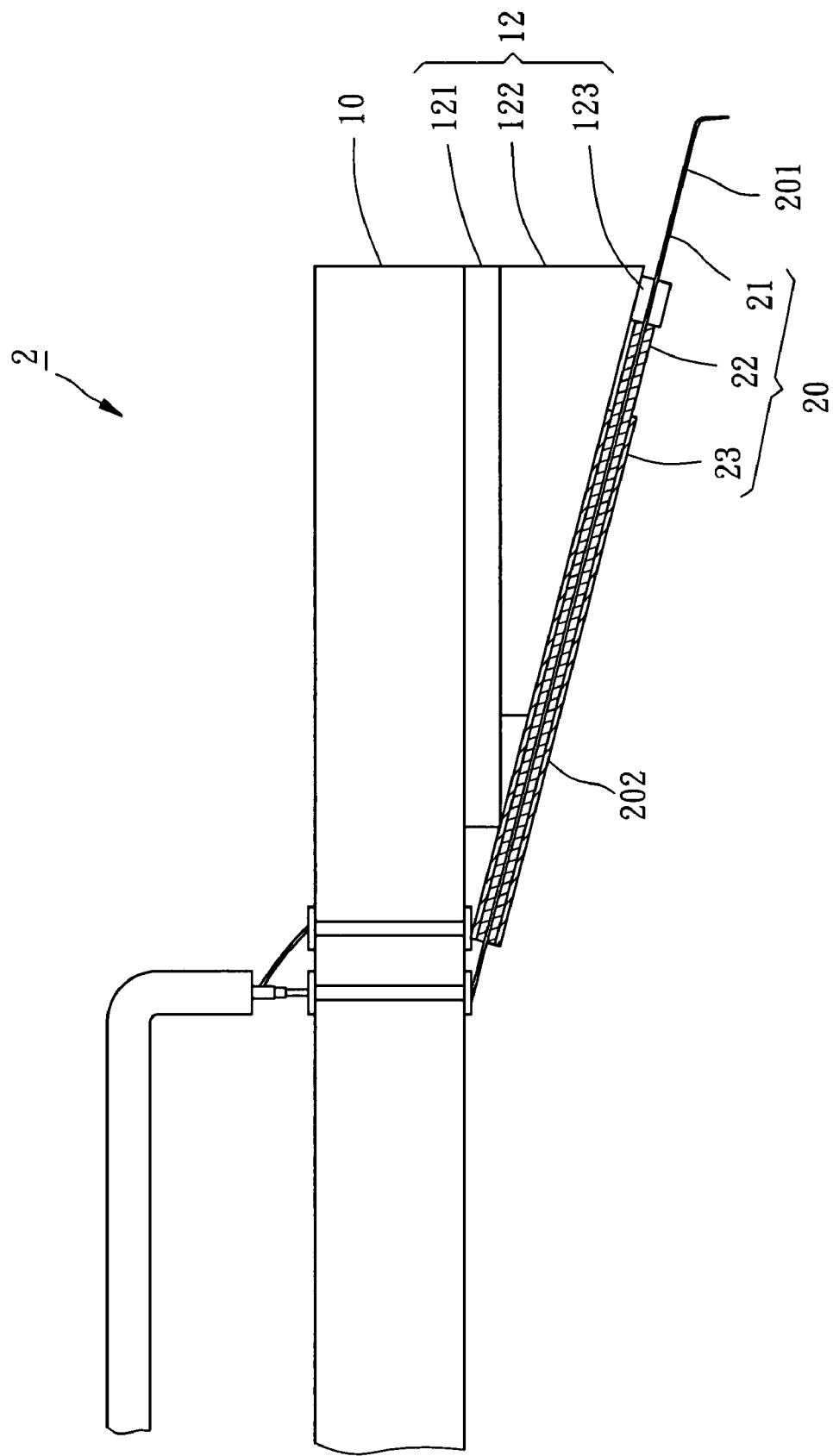
FIG. 2 is schematic sectional view of another design of cantilever probe card according to the prior art.

Referring to FIGS. 3-6, a cantilever-type probe card 3 for testing semiconductor wafers or the like in accordance with a first embodiment of the present invention is shown comprised of a circuit board 30, a probe holder 40, a grounding block 50, a plurality of signal probes 60, and a plurality of grounding probes 70.

Figure 3:
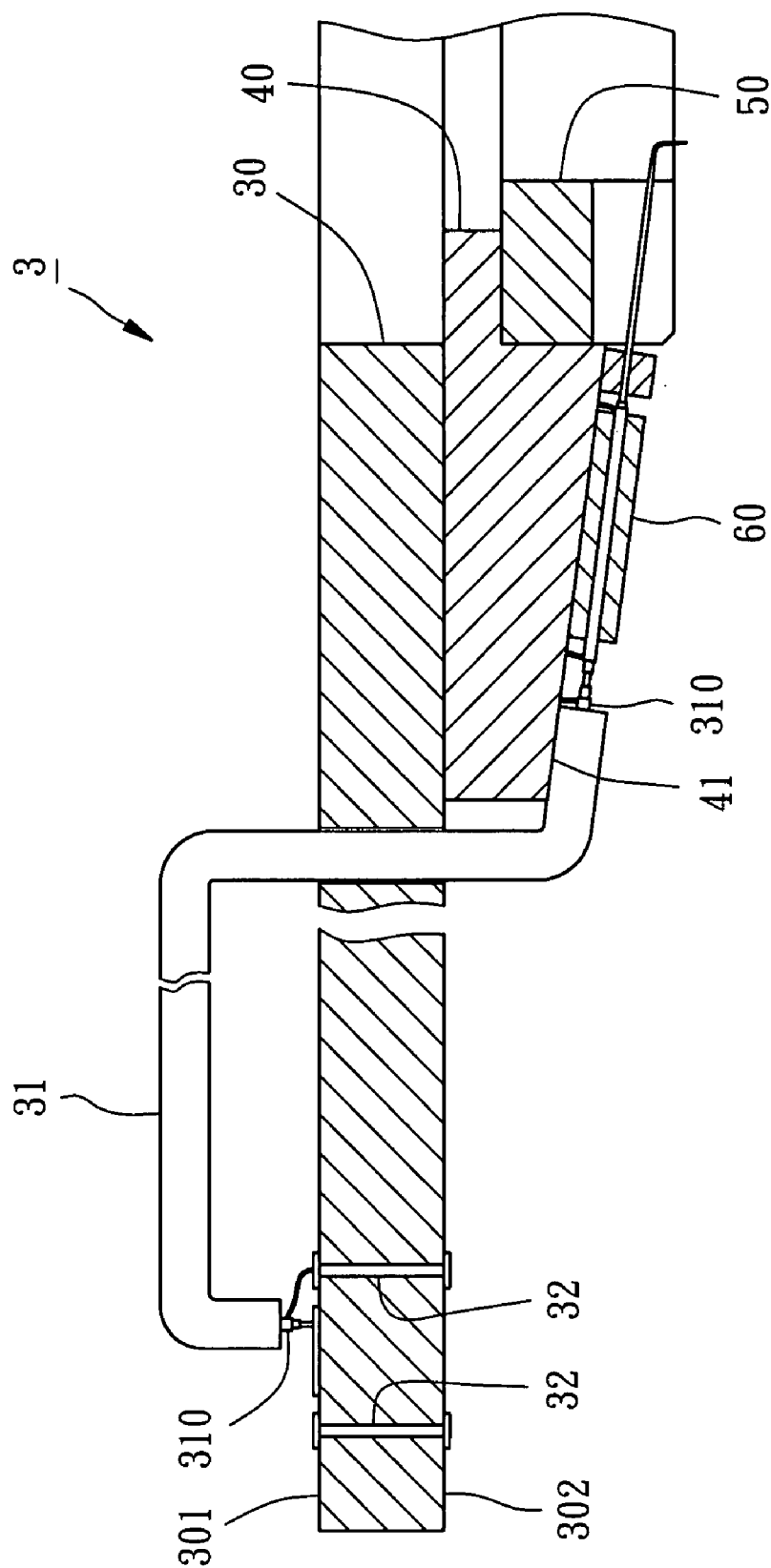
FIG. 3 is a schematic sectional view of a cantilever-type probe card in accordance with a first embodiment of the present invention.

The circuit board 30 defines a top surface 301 and a bottom surface 302 opposite to the top surface 301. The top surface 301 is adapted to be electrically connected to a test machine (not shown), which is controllable to output high frequency test signals to the probe card 3. The circuit board 30 has arranged thereon electronic circuits, including multiple signal lines 31 and grounding lines 32. As shown in FIG. 3, the signal lines 31 are coaxial transmission lines for the transmission of high frequency signals, and extended from the top surface 301 to the bottom surface 302 and then respectively electrically connected to the signal probes 60. Further, each of the signal lines 31 is provided with a coaxially arranged a metal shield 310 electrically connected to one grounding line 32 of the circuit board 30. The grounding lines 32 may be directly or indirectly connected to the ground potential of the test machine so as to provide the connection of electric grounding for the circuit board 30 and to maintain the characteristic impedance of high frequency signaling through the signal lines 31.

Figure 4:
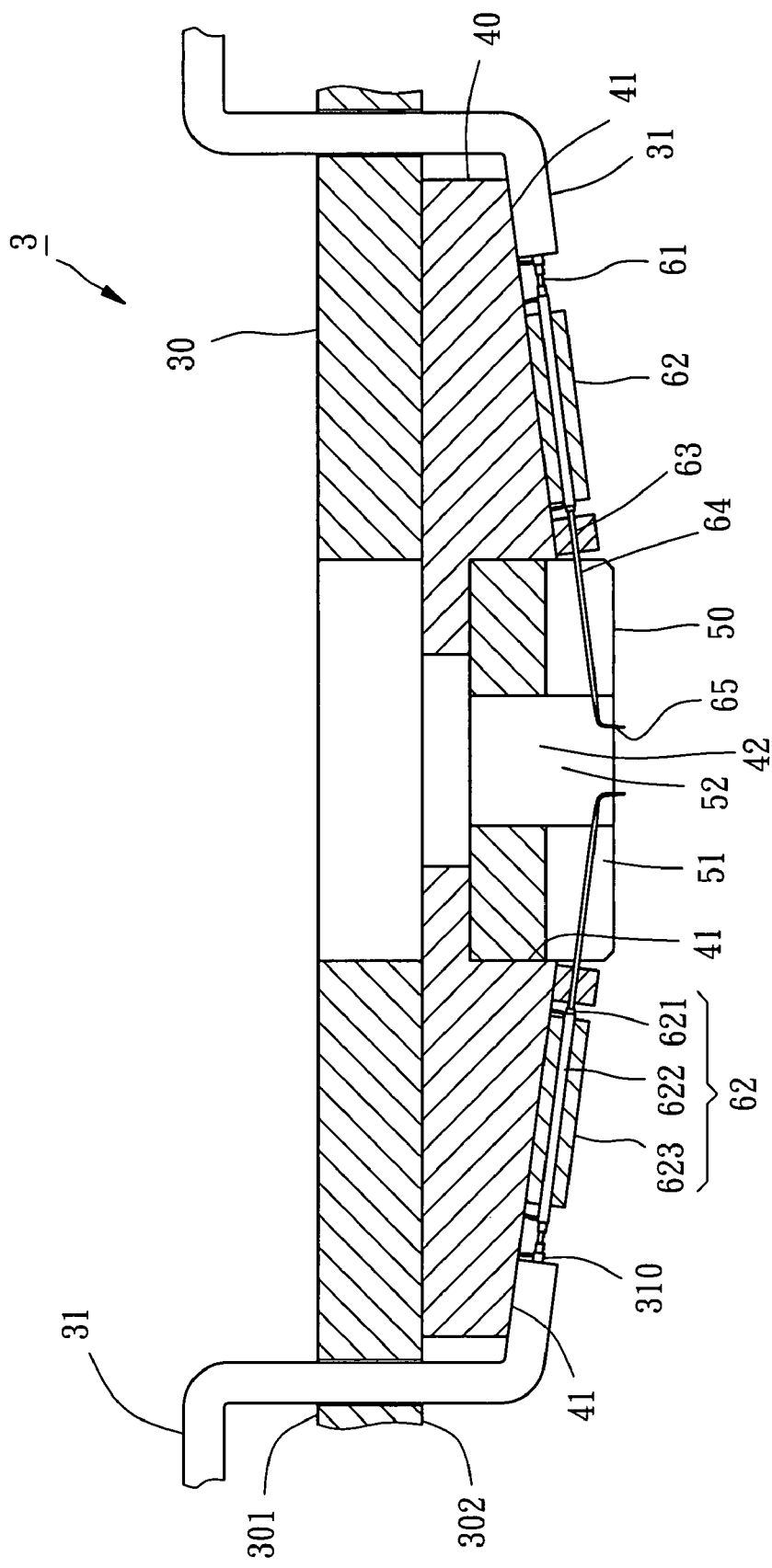
FIG. 4 is a schematic sectional view of a part of the first embodiment of the present invention, showing the arrangement of the probe holder, the grounding block and the signal probes at the center of the cantilever-type probe card.
Figure 5:
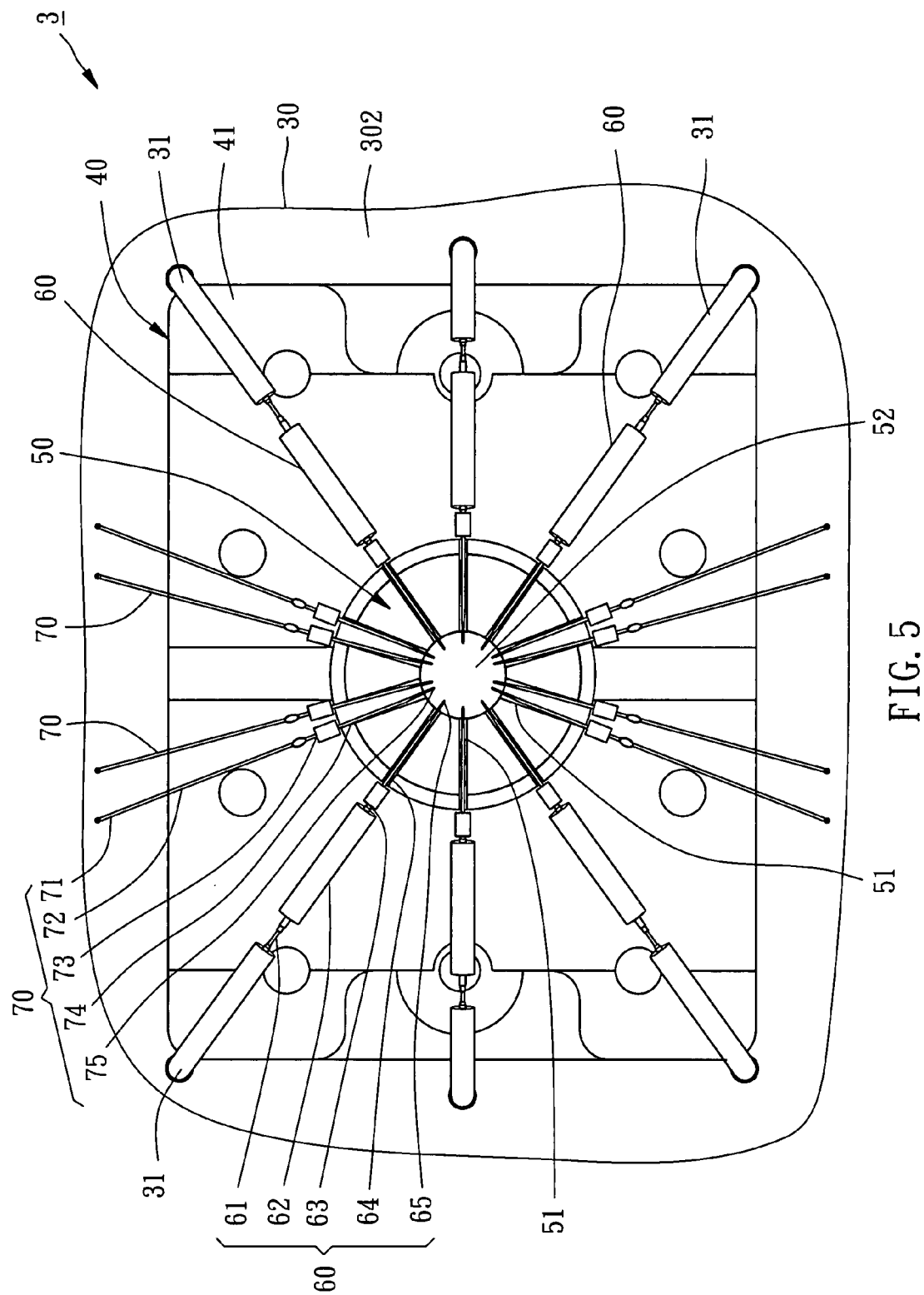
FIG. 5 is a schematic bottom view of a part of the first embodiment of the present invention, showing the arrangement of the probe holder, the grounding block and the signal probes at the center of the cantilever-type probe card.

Referring to FIGS. 3 and 4, the probe holder 40 is mounted on the bottom surface 302 of the circuit board 30, having a grounding plane 41 and a center recess 42 for accommodating the grounding block 50. According to this embodiment, the probe holder 40 is made of conducting material so that the outer surface of the probe holder 40 constitutes the grounding plane 41. Alternatively, the probe holder 40 can be formed of an insulating material with an electrically conducting layer arranged thereon to provide the desired grounding plane 41. The grounding plane 41 is electrically connected to the metal shield 310 of each of the signal lines 31 so that the grounding plane 41 works as a plane of electrically common grounded for the grounding lines 32 of the circuit board 30. Referring also to FIG. 5, the probe holder 40 is adapted to hold the probes 60 and 70. The signal probes 60 are respectively connected to the signal lines 31 at the probe holder 40.

Figure 6:
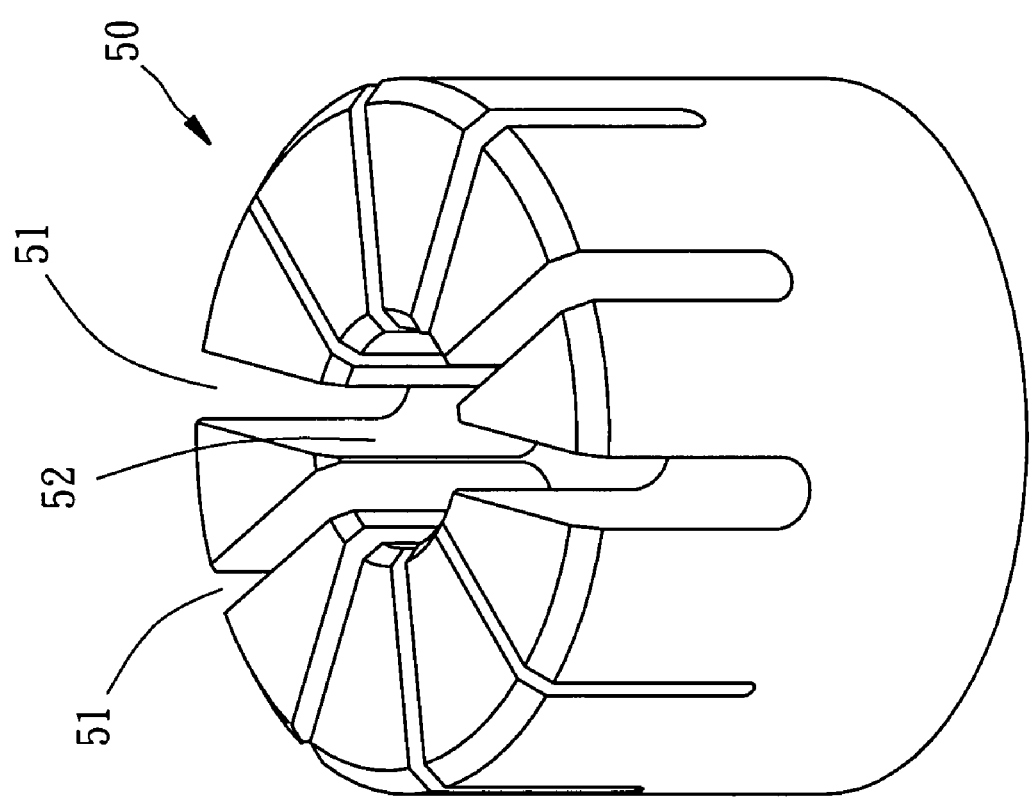
FIG. 6 is a perspective view of a grounding block for the cantilever-type probe card according to the first embodiment of the present invention.

Referring to FIG. 6 and FIG. 5 again, the grounding block 50 made of conducting material is mounted in the center recess 42 of the probe holder 40 and directly contacted with the grounding plane 41, having a center through hole 52 and a plurality of grooves 51 radially arranged around the center through hole 52. The probes 60 and 70 are respectively extended from the probe holder 40 into the grooves 51 then ended in the center through hole 52 of the grounding block 50. Each of the grooves 51 has a transverse width sufficient for accommodating a predetermined number of the probes 60 and 70. According to this embodiment, one signal probe 60 is received respectively in one groove 51 to prevent short circuit between adjacent probes 60 and 70. The grooves 51 are spaced from one another at a predetermined pitch to prevent electric interference among the signal probes 60.

Referring to FIGS. 4 and 5 again, each of the probes 60 and 70 is defined in proper order as an endpiece 61 or 71, a body 62 or 72, a connection portion 63 or 73, a front arm 64 or 74, and a probing tip 65 or 75. The endpieces 61 of the signal probes 60 are respectively electrically connected to the signal lines 31. The grounding probes 70 are respectively bared metal needles electrically connected with their bodies 72 to the grounding plane 41, thereby obtaining the ground potential indirectly. Alternatively, the endpieces 71 of the grounding probes 70 can be directly connected to the ground potential. The body 62 of each of the signal probes 60 is a coaxial structure, i.e., a bared needle surrounded in proper order by a dielectric layer 621, a grounding layer 622 and a protective layer 623. The grounding layer 622 is electrically connected to the grounding plane 41. Therefore, the grounding plane 41 also works as a plane of electrically common grounded for the grounding layers 622 of the signal probes 60. The connection portions 63 and 73 of the probes 60 and 70 are affixed to the probe holder 40. The front arms 64 and 74 of the probes 60 and 70 are respectively extended along the grooves 51 of the grounding block 50. The probing tips 65 and 75 of the probes 60 and 70 are extended into the center through hole 52 and protruded beneath the grounding block 50.

Figure 7:
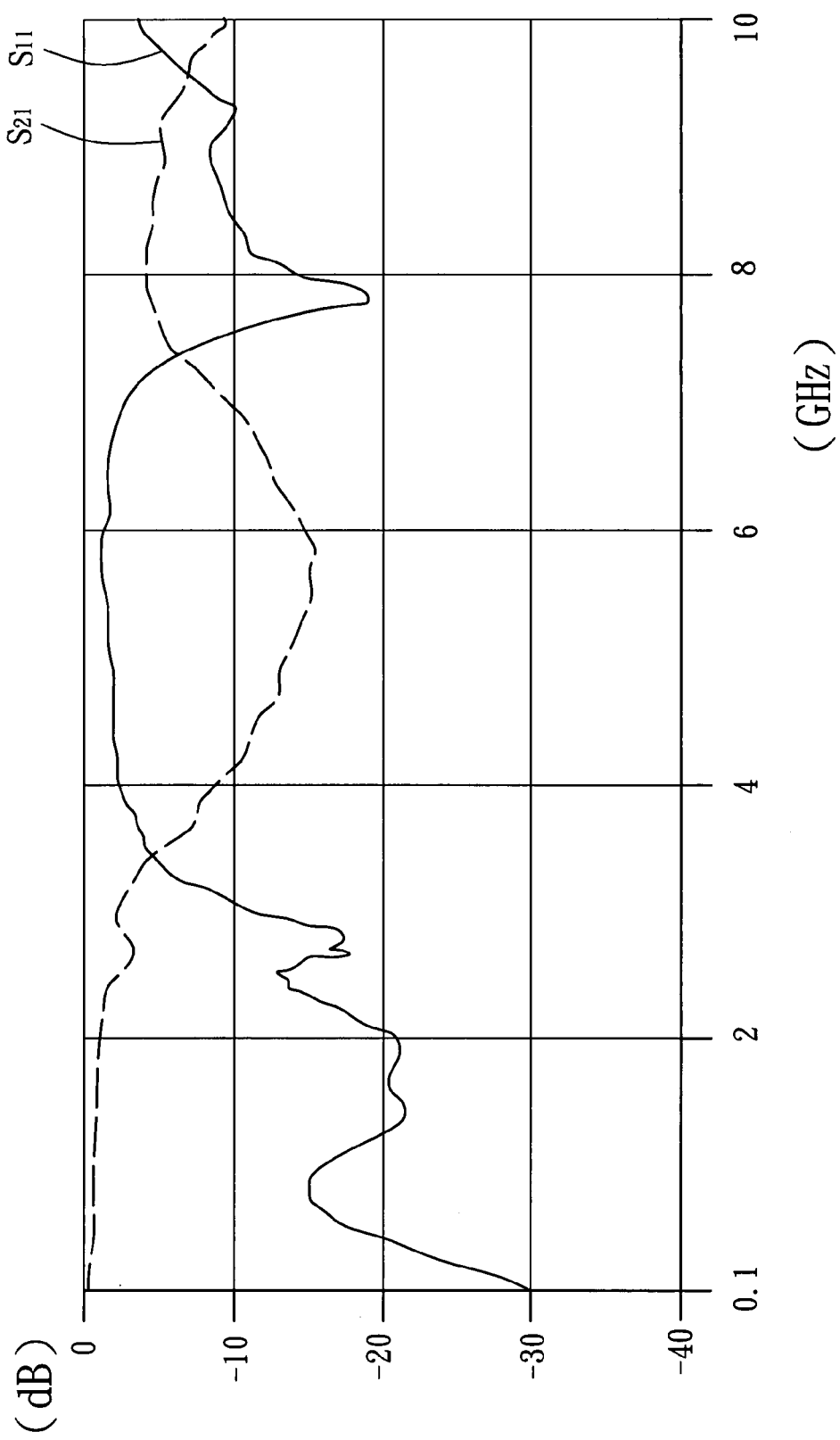
FIG. 7 is a high frequency characteristic chart measured from a cantilever-type probe card of a prior art.
Figure 8:
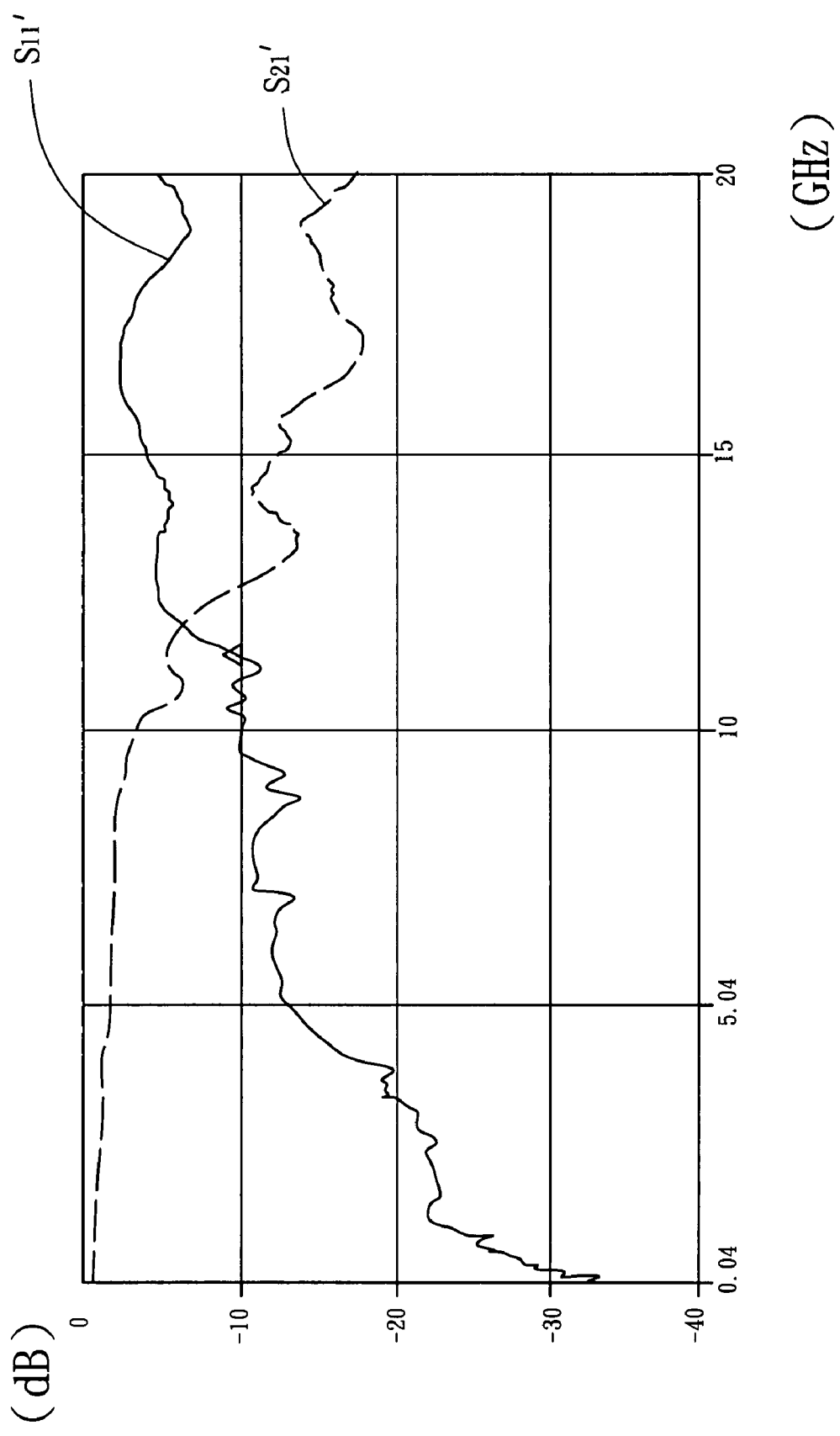
FIG. 8 is a high frequency characteristic chart measured from a cantilever-type probe card according to the first embodiment of the present invention.

When comparing to the conventional designs, the invention has additionally installed the grounding block 50 in the probe card 3. The grooves 51 of the grounding block 50 have a specific depth to provide a sufficient vertical displacement for each of the front arms 64 and 74 of the probes 60 and 70 to avoid accidental contact between the front arms 64 and 74 and the grounding block 50 during probing of the probing tips 65 and 75 of the probes 60 and 70 on the ICs of the test wafer. Therefore, the vertical displacement of the front arms 64 and 74 corresponds to a longitudinal buffer for the probing tips 65 and 75 to maintain optimal contact between the probing tips 65 and 75 and the ICs of the test wafer and to buffer the anti-force acted upon the probes 60 and 70. After connection of the electronic circuits of the probe card 3 to the test machine, high frequency signals are transmitted from the test machine through the coaxial signal lines 31 to the signal probes 60. Because the front arms 64 and 74 of the probes 60 and 70 are suspended in the grooves 51 of the grounding block 50 and kept spaced from the nearby grounding block 50 at a predetermined pitch, and because of the arrangement of the grounding layers 622 of the signal probes 60, the impedance characteristic is well maintained for high frequency signaling through the signal probes 60, as well as preventing unnecessary electric interference or coupling effect, and therefore the probe card 3 has a high reliability in high-frequency test application. FIGS. 7 and 8 show two high-frequency characteristic curves respectively measured from a cantilever-type probe card 2 according to the prior art and the probe card 3 according to the present invention. As indicated by the return loss curves S11 and S11' in the two characteristic curves, the probe card 3 of the present invention shows a relative low return loss, i.e., a high-frequency signal transmitted through the probe card 3 of the present invention shows an excellent characteristic impedance matching. When viewed the insertion loss curves S21 and S21', the passband limitation at the gain of −3 dB of the cantilever-type probe card 2 of the prior art at is only about 3.3 GHz, much lower than 10 GHz of the probe card 3 of the present invention. These data show super high frequency signal transmission quality of the probe card 3 of the present invention over the cantilever-type probe card 2 of the prior art.

Figure 9:
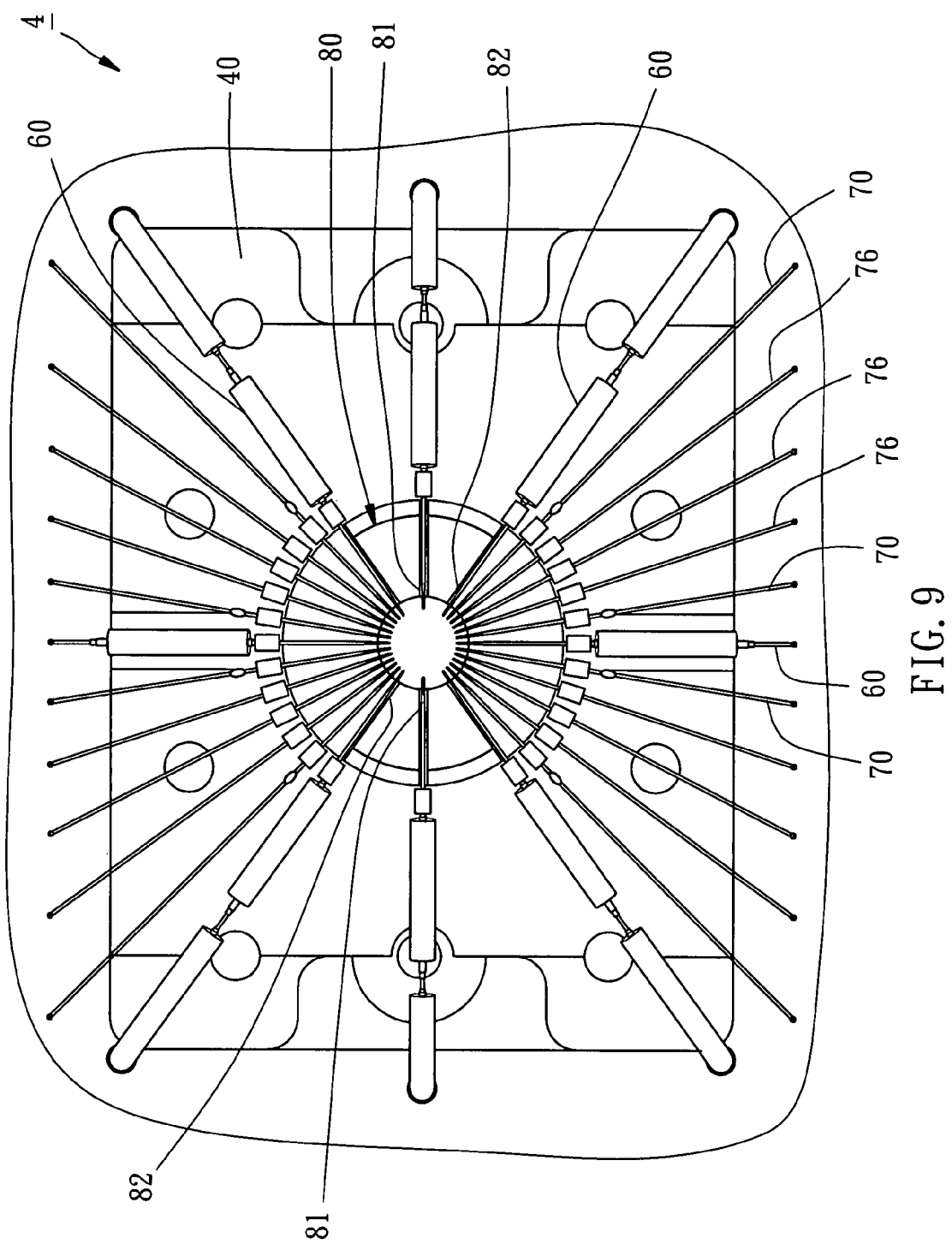
FIG. 9 is a schematic bottom view of a part of a cantilever-type probe card in accordance with a second embodiment of the present invention.

Further, the probe card of the present invention utilizes the grounded characteristic of the grounding block 50 to maintain the characteristic impedance matching of the signal probes during high frequency signaling. Accordingly, when each of the signal probes 60 is kept in the grounding block 50 at a predetermined pitch, the grounding potential is accompanied to prevent unnecessary electric interference during transmission of a high frequency signal. Therefore, the arrangement of one single signal probe in one single groove of the grounding block is not a limitation. FIG. 9 shows a cantilever-type probe card 4 in accordance with a second embodiment of the present invention. This embodiment is practical for intermediate-frequency test requirements and a part of high-frequency test. The transmission of an intermediate-frequency test signal is not limited to the use of the aforesaid signal line 31 and signal probe 60. Metal wires and low-frequency signal probes 76 are used in this second embodiment for the transmission of intermediate-frequency test signals. The low-frequency signal probes 76 are similar as the grounding probes 70 with bared needles but insulated with the probe holder 40. According to this second embodiment, the probe card 4 comprises a grounding block 80. The grounding block 80 has two first grooves 81 and two second grooves 82. The first grooves 81 have structural features similar to the aforesaid first embodiment, and each is adapted to accommodate one of the signal probes 60. Each of the second grooves 82 has a relatively wider transverse width than the first groove 81 for accommodating multiple probes 60, 70, and/or 76. Because the signal probes 60 accommodated in the first groove 81 are set adjacent to the grounding block 80 or kept spaced between two grounding probes 70, the desired characteristic impedance matching during the transmission of a high frequency test signal through the probe card 4 is obtained, also each of the signal probes 60 is protected against electric interference to ensure a high-quality transmission of a high frequency test signal.

Figure 10:
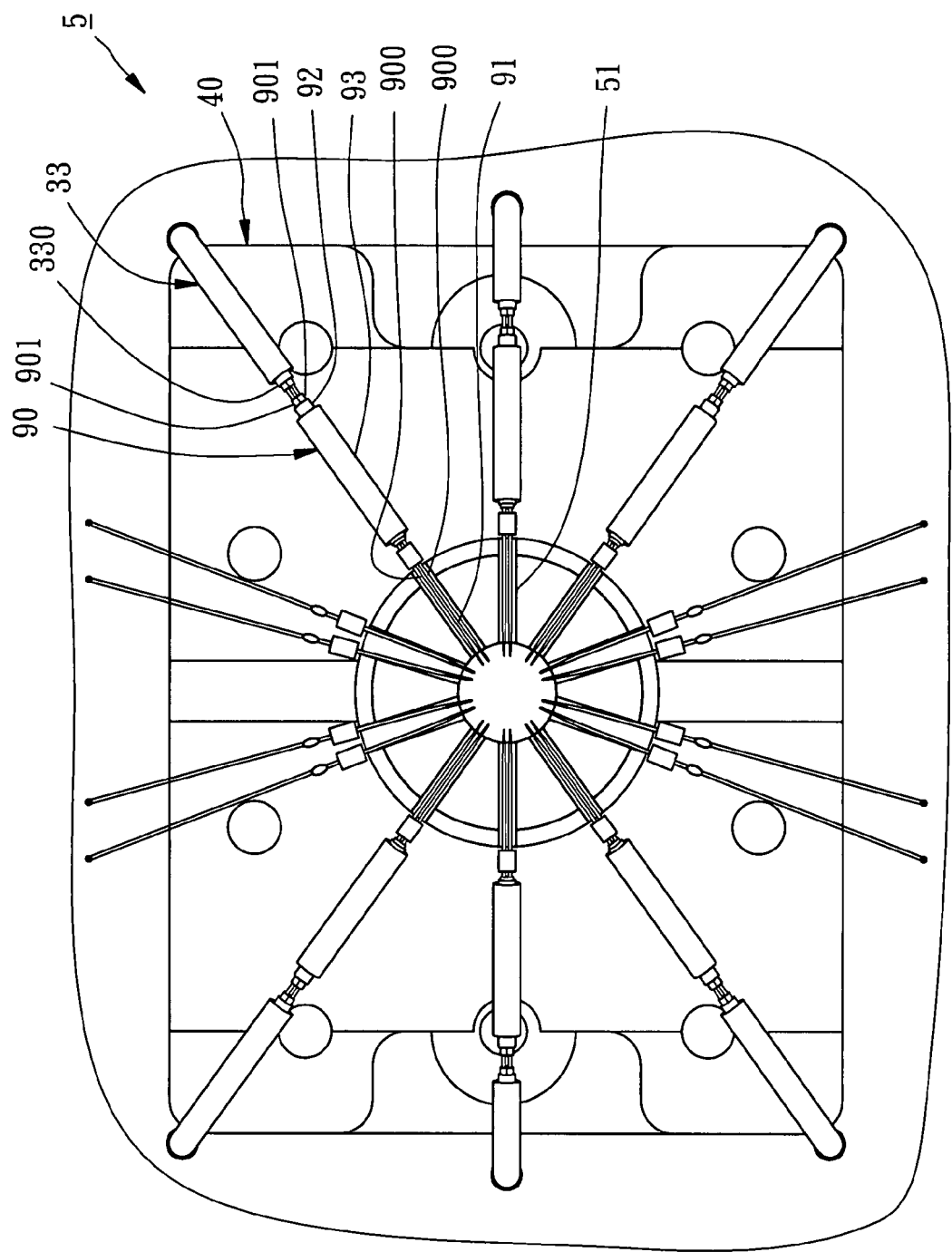
FIG. 10 is a schematic bottom view of a part of a cantilever-type probe card in accordance with a third embodiment of the present invention.

Further, the signal probes of a cantilever-type probe card in accordance with the present invention are not limited to the aforesaid coaxial probe structure. FIG. 10 shows a cantilever-type probe card 5 in accordance with a third embodiment of the present invention for use in measure of LCD driver IC with high-frequency differential signaling. As illustrated, differential transmission lines 33 and differential probes 90 are used in this embodiment to substitute for the aforesaid signal lines 31 and signal probes 60. Each of the differential transmission lines 33 is a biaxial wiring structure, comprises dual wires surrounded coaxially by a metal shield 330 that is electrically connected to the probe holder 40. Each probe 90 comprises two bared needles 900 that are spaced from each other at a predetermined pitch and electrically connected to the associating differential transmission line 33, two dielectric layers 901 respectively surrounding the bared needles 900, a grounding layer 92 surrounding the two dielectric layers 901 and electrically connecting to the probe holder 40, and a protective layer 93 surrounding the grounding layer 92 and fixing to the probe holder 40. The front arm 91 of each probe 90 is simply a part of the bared needles 900 and suspended in one groove 51. By means of the grounding feature of the metal shield 330 of the differential transmission line 33 and the grounding layer 92 of the differential probe 90 and the arrangement of the bared needles 900 of the differential probe 90 in the respective groove 51, the characteristic impedance matching is maintained during transmission of a high-frequency differential signal through the probe card 5.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cantilever-type probe card comprising:

a circuit board arranged thereon with a plurality of signal lines and a grounding block, said grounding block being a metal block electrically connected to a zero potential, said grounding block having a center through hole and a plurality of grooves radially arranged around said center through hole; and a plurality of signal probes and at least one grounding probe made of a conducting metal material, said signal probes being respectively electrically connected to said signal lines, said at least one grounding probe being electrically connected to said grounding block, said at least one grounding probe having a connection portion, a probing tip, and a front arm defined between said connection portion and said probing tip, each of said signal probes having at least one connection portion, at least one probing tip, and at least one front arm defined between said connection portion and said probing tip, the connection portions of said signal probes and said at least one grounding probe being fastened to said circuit board, the front arms of said signal probes and said at least one grounding probe being suspended in the grooves of said grounding block and spaced from said grounding block at a predetermined pitch to support the respective probing tips protruding outside said grounding block;

wherein said grooves have a specific depth to provide a sufficient vertical displacement for each of the front arms of said signal probes and said at least one grounding probe to avoid accidental contact between the front arms and the grounding block, wherein the vertical displacement of the front arms corresponds to a longitudinal buffer for the probing tips to buffer the anti-force acted upon the probes.

2. The cantilever-type probe card as claimed in claim 1, which said circuit board has two opposite surfaces; said signal lines are coaxial transmission lines extended to the two opposite surfaces of said circuit board, each having a coaxial metal shield electrically connected to said grounding block.

3. The cantilever-type probe card as claimed in claim 1, wherein said circuit board has a probe holder mounted thereon, said probe holder having a recess; the connection portions of said signal probes and said at least one grounding probe are affixed to said probe holder adjacent to the recess of said probe holder; said grounding block is mounted in the recess of said probe holder.

4. The cantilever-type probe card as claimed in claim 3, wherein said probe holder has a grounding plane made of a conducting metal material and electrically connected to said grounding block.

5. The cantilever-type probe card as claimed in claim 4, wherein said probe holder is made of a conducting metal material, having an outer surface that constitutes said grounding plane.

6. The cantilever-type probe card as claimed in claim 4, wherein each said signal probe has two distal ends respectively terminating in an endpiece and the probing tip, and is surrounded by a dielectric layer between the respective endpiece and the respective connection portion and a grounding layer around the dielectric layer, said grounding layer being formed of a conducting metal material and electrically connected to said grounding plane of said probe holder.

7. The cantilever-type probe card as claimed in claim 1, wherein said signal probes are respectively inserted through the grooves of said grounding block.

8. The cantilever-type probe card as claimed in claim 1, wherein said signal probes are respectively arranged in the grooves of said grounding block in such a manner that each said signal probe is adjacent to said grounding block and said at least one grounding probe.

9. A cantilever-type probe card comprising:
a circuit board arranged thereon with a plurality of signal lines and a grounding block, said grounding block being a metal block electrically connected to a zero potential and having a plurality of grooves, said grooves each having a predetermined depth; and
a plurality of signal probes and at least one grounding probe made of a conducting metal material, said signal probes being respectively electrically connected to said signal lines, said at least one grounding probe being electrically connected to said grounding block, said signal probes and said at least one grounding probe each having a connection portion, a probing tip, and a front arm defined between said connection portion and said probing tip, the connection portions of said signal probes and said at least one grounding probe being fastened to said circuit board, the front arms of said signal probes and said at least one grounding probe being suspended in said grooves of said grounding block, the front arm of each of said signal probes being kept a predetermined space transversely from said grounding block and flexible longitudinally along the respective depth of each of said grooves, the probing tips of said signal probes and said at least one grounding probe being protruded out of said grounding block.

10. The cantilever-type probe card as claimed in claim 9, wherein said circuit board has a probe holder mounted thereon, said probe holder having a recess; the connection portions of said signal probes and said at least one grounding probe are affixed to said probe holder adjacent to the recess of said probe holder; said grounding block is mounted in the recess of said probe holder.

11. The cantilever-type probe card as claimed in claim 10, wherein said probe holder has a grounding plane made of a conducting metal material and electrically connected to said grounding block.

* * * * *